United States Patent
Shin et al.

(10) Patent No.: US 12,217,958 B2
(45) Date of Patent: Feb. 4, 2025

(54) METHOD OF PRE-TREATING SUBSTRATE AND METHOD OF DIRECTLY FORMING GRAPHENE USING THE SAME

(71) Applicant: Samsung Electronics Co., Ltd., Suwon-si (KR)

(72) Inventors: Keunwook Shin, Yongin-si (KR); Janghee Lee, Yongin-si (KR); Seunggeol Nam, Suwon-si (KR); Hyeonjin Shin, Suwon-si (KR); Hyunseok Lim, Suwon-si (KR); Alum Jung, Suwon-si (KR); Kyung-Eun Byun, Seongnam-si (KR); Jeonil Lee, Suwon-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 445 days.

(21) Appl. No.: 16/807,702

(22) Filed: Mar. 3, 2020

(65) Prior Publication Data

US 2020/0286732 A1    Sep. 10, 2020

(30) Foreign Application Priority Data

Mar. 4, 2019 (KR) .................. 10-2019-0024851
Mar. 3, 2020 (KR) .................. 10-2020-0026762

(51) Int. Cl.
*C23C 16/02* (2006.01)
*C23C 16/26* (2006.01)
*H01L 21/02* (2006.01)

(52) U.S. Cl.
CPC ........ *H01L 21/02527* (2013.01); *C23C 16/02* (2013.01); *C23C 16/26* (2013.01); *H01L 21/0257* (2013.01); *H01L 21/02658* (2013.01)

(58) Field of Classification Search
CPC ...... C23C 16/02; C23C 16/0272; C23C 16/26
See application file for complete search history.

(56) References Cited

U.S. PATENT DOCUMENTS

| | | | | |
|---|---|---|---|---|
| 5,308,661 A | * | 5/1994 | Feng | C23C 16/277 427/535 |
| 5,397,428 A | * | 3/1995 | Stoner | C23C 16/02 117/103 |
| 6,413,681 B1 | * | 7/2002 | Noguchi | C23C 16/271 427/249.8 |

(Continued)

FOREIGN PATENT DOCUMENTS

| | | | | |
|---|---|---|---|---|
| CN | 102367570 A | * | 3/2012 | ............. C23C 16/26 |
| CN | 105668555 B |  | 4/2018 | |

(Continued)

OTHER PUBLICATIONS

Bayraktar, Oguz, et al., "Effect of pretreatment on the performance of metal-contaminated fluid catalytic cracking (FCC) catalysts". Applied Catalysis A: General 260 (2004) 119-124.*

(Continued)

*Primary Examiner* — Bret P Chen
(74) *Attorney, Agent, or Firm* — HARNESS, DICKEY & PIERCE, P.L.C.

(57) ABSTRACT

A method of pre-treating a substrate on which graphene will be directly formed may include pre-treating the substrate using a pre-treatment gas including at least a carbon source and hydrogen.

31 Claims, 9 Drawing Sheets

| PRE-TREATMENT GAS COMPONENT | SUPPLY METHOD | | | |
|---|---|---|---|---|
| | FIRST SUPPLY METHOD | SECOND SUPPLY METHOD | THIRD SUPPLY METHOD | FOURTH SUPPLY METHOD |
| CARBON SOURCE | CONTINUOUS | DISCONTINUOUS (TIME DIVISION) | CONTINUOUS | DISCONTINUOUS (TIME DIVISION) |
| HYDROGEN ($H_2$) | CONTINUOUS | CONTINUOUS | DISCONTINUOUS (TIME DIVISION) | DISCONTINUOUS (TIME DIVISION) |

(56) References Cited

U.S. PATENT DOCUMENTS

| | | | |
|---|---|---|---|
| 6,544,599 B1* | 4/2003 | Brown | C23C 4/123 427/383.1 |
| 7,063,742 B1* | 6/2006 | Ando | C30B 29/04 117/103 |
| 9,761,669 B1* | 9/2017 | Arnold | H01L 21/0262 |
| 10,023,468 B2* | 7/2018 | Vlassiouk | C01B 32/186 |
| 2001/0033899 A1* | 10/2001 | Noguchi | C23C 16/0254 427/460 |
| 2006/0203346 A1* | 9/2006 | Noguchi | H01L 21/02491 257/E21.096 |
| 2009/0324892 A1* | 12/2009 | Hasegawa | C23C 16/26 428/339 |
| 2010/0178234 A1* | 7/2010 | Noguchi | C30B 29/04 423/446 |
| 2010/0178730 A1* | 7/2010 | Noguchi | C23C 16/4582 438/105 |
| 2011/0117361 A1* | 5/2011 | Hamilton | C09D 5/24 977/734 |
| 2011/0318490 A1* | 12/2011 | Schafer | C23C 16/452 118/724 |
| 2012/0090982 A1* | 4/2012 | Fullerton | B82Y 40/00 422/186.01 |
| 2012/0228555 A1* | 9/2012 | Cheng | C01B 32/184 977/734 |
| 2013/0243969 A1* | 9/2013 | Teng | C01B 32/186 427/249.1 |
| 2013/0266739 A1* | 10/2013 | Lin | C23C 14/34 427/535 |
| 2013/0287956 A1* | 10/2013 | Patil | B82Y 30/00 427/333 |
| 2014/0234200 A1* | 8/2014 | Tour | C01B 32/184 423/448 |
| 2014/0326700 A1* | 11/2014 | Bouchiat | C23C 16/26 156/345.52 |
| 2016/0031712 A1* | 2/2016 | Moon | C23C 16/26 427/249.1 |
| 2016/0258081 A1* | 9/2016 | Özyilmaz | C01B 32/188 |
| 2016/0280968 A1* | 9/2016 | Lee | B01J 2/003 |
| 2016/0365165 A1* | 12/2016 | Jo | H01B 1/026 |
| 2017/0057826 A1* | 3/2017 | Strudwick | C23C 16/26 |
| 2017/0330746 A1* | 11/2017 | Koeck | H01L 21/0262 |
| 2018/0187331 A1* | 7/2018 | List, III | C23C 16/26 |
| 2018/0362393 A1* | 12/2018 | Bi | C23C 16/26 |

FOREIGN PATENT DOCUMENTS

| | | | | |
|---|---|---|---|---|
| DE | 19844538 A1 * | 3/2000 | | C23C 16/26 |
| EP | 0826798 A2 * | 3/1998 | | C30B 25/02 |
| JP | 60-186500 * | 9/1985 | | |
| KR | 20140005470 A | 1/2014 | | |
| KR | 20140090333 A | 7/2014 | | |
| KR | 20140135725 A | 11/2014 | | |
| KR | 20160106384 A | 9/2016 | | |
| WO | WO 2014/181989 A1 * | 11/2014 | | C01B 31/02 |
| WO | WO 2015/189575 A1 * | 12/2015 | | C01B 31/02 |

OTHER PUBLICATIONS

Choi, Won Seok, et al., "Effect of hydrogen plasma pretreatment on growth of carbon nanotubes by MPECVD". Materials Science and Engineering C 26 (2006) 1211-1214.*

Crossley, Benjamin L., et al., "Effects of hydrogen pretreatment on physical-vapor-deposited nickel catalyst for multi-walled carbon nanotube growth". Journal of Nanophotonics, vol. 4, 049502 (Feb. 17, 2010), pp. 1-6.*

Wang, Wen-Pin, et al., "The effects of hydrogen plasma pretreatment on the formation of vertically aligned carbon nanotubes". Applied Surface Science 253 (2007) 9248-9253.*

Strudwick, Andrew James, et al., "Chemical Vapor Deposition of High Quality Graphene Films from Carbon Dioxide Atmospheres". ACS Nano, vol. 9, No. 1, (2015) pp. 31-42.*

Yan, Zheng, et al., "Chemical Vapor Deposition of Graphene Single Crystals". Accounts of Chemical Research, 2014, 47, 1327-1337.*

Seekaew, Yotsarayuth, et al., "Conversion of Carbon Dioxide into Chemical Vapor Deposited Graphene with Controllable Number of Layers via Hydrogen Plasma Pre-Treatment". Membranes, 2022, 12, 796, pp. 1-11.*

Lei, Hong, et al., "Graphene enhanced low-density polyethylene by pretreatment and melt compounding". RSC Advances, 2016, 6, 101492-101500.*

Kim, Min-Sik, et al., "Effect of copper surface pre-treatment on the properties of CVD grown graphene". AIP Advances 4, 127107 (2014), pp. 1-8.*

Zhang, Xueping, et al., "Effect of the pretreatment on the performances of graphene composite-supported Pt nanoparticle electrocatalyst". Ionics (2015) 21:449-458.*

Hu, Xudong, et al., "The effect of copper pretreatment on graphene synthesis by ion implantation into Ni/Cusubstrate". Semicond . Sci. Technol. 33 (2018) 074001 pp. 1-6.*

Han, Gang Hee, et al., "Influence of Copper Morphology in Forming Nucleation Seeds for Graphene Growth". Nano Letters, 2011, 11, 4144-4148.*

Wu, Tianru, et al., "Continuous graphene films synthesized at low temperatures byintroducing coronene as nucleation seeds". Nanoscale, 2013, 5, 5456-5461.*

Vlassiouk, Ivan, et al., "Role of Hydrogen in Chemical Vapor Deposition Growth of Large Single-Crystal Graphene". ACS Nano, vol. 5, No. 7, (2011) 6069-6076.*

Shin, Woo Cheol, et al., "Functionalized Graphene as an Ultrathin Seed Layer for the Atomic Layer Deposition of Conformal High-k Dielectrics on Graphene". ACS Appl. Mater. Interfaces 2013, 5, 11515-11519.*

* cited by examiner

FIG. 6A

| PRE-TREATMENT GAS COMPONENT | SUPPLY METHOD | | | |
|---|---|---|---|---|
| | FIRST SUPPLY METHOD | SECOND SUPPLY METHOD | THIRD SUPPLY METHOD | FOURTH SUPPLY METHOD |
| CARBON SOURCE | CONTINUOUS | DISCONTINUOUS (TIME DIVISION) | CONTINUOUS | DISCONTINUOUS (TIME DIVISION) |
| HYDROGEN ($H_2$) | CONTINUOUS | CONTINUOUS | DISCONTINUOUS (TIME DIVISION) | DISCONTINUOUS (TIME DIVISION) | ized
METHOD OF PRE-TREATING SUBSTRATE AND METHOD OF DIRECTLY FORMING GRAPHENE USING THE SAME

CROSS-REFERENCE TO RELATED APPLICATION

This application claims the benefit of Korean Patent Application Nos. 10-2019-0024851, filed on Mar. 4, 2019, and 10-2020-0026762, filed on Mar. 3, 2020, in the Korean Intellectual Property Office, the entire disclosures of which are incorporated herein by reference.

BACKGROUND

1. Field

The present disclosure relates to methods of forming a material on a substrate, and more particularly, to methods of pre-treating a substrate in a process of forming graphene and methods of directly forming graphene by using the methods of pre-treating a substrate.

2. Description of Related Art

The usage of graphene has gradually increased due to its high physical, electrical, and optical characteristics, and, in particular, graphene has drawn attention as a new material in semiconductor fields. In order to apply graphene in a semiconductor process, research has been actively conducted into methods of directly forming graphene on a non-catalyst substrate.

As a widely known method of forming graphene, after forming graphene on a metal substrate by using a chemical vapor deposition (CVD) method, the formed graphene is transferred onto another desired substrate.

SUMMARY

Provided are methods of pre-treating a substrate to minimize a physical change of the substrate in a process of forming graphene.

Provided are methods of directly forming graphene by using the methods of pre-treating a substrate.

Additional aspects will be set forth in part in the description which follows and, in part, will be apparent from the description, or may be learned by practice of the presented embodiments.

In the method of substrate pre-treatment in a method of directly forming graphene according to an embodiment, the substrate may be pre-treated using a pre-treatment gas including at least a carbon source and hydrogen.

In some embodiments, the pre-treatment gas may include the carbon source and the hydrogen, and the pre-treatment gas may further include $N_2$, a noble gas, or both $N_2$ and a noble gas.

In some embodiments, the pre-treating the substrate may include discontinuously suppling the at least one of the carbon source and the hydrogen of the pre-treatment gas to the substrate.

In some embodiments, the pre-treating the substrate may include preparing a mixed pre-treatment gas, based on mixing the carbon source and the hydrogen outside a chamber before the graphene is directly formed on the substrate, and supplying the mixed pre-treatment gas to the chamber while the substrate is placed in the chamber.

In some embodiments, the pre-treating the substrate may include supplying the carbon source and the hydrogen individually supplied to a chamber where the substrate is placed, and the carbon source and the hydrogen may be mixed in the chamber during the pre-treating the substrate.

In some embodiments, the carbon source may be represented by the formula $C_xH_y$, where x may be in a range from 1 to 12, and y may be in a range from 2 to 26.

In some embodiments, the pre-treating the substrate may include continuously supplying the carbon source and the hydrogen in the pre-treatment gas during the pre-treating the substrate.

In some embodiments, a supply rate of the carbon source to the substrate and a supply rate of the hydrogen to the substrate may be maintained constant during the pre-treating the substrate.

In some embodiments, a supply rate of the carbon source to the substrate, a supply rate of the hydrogen to the substrate, or both the supply rate of the carbon source to the substrate and the supply rate of the hydrogen to the substrate may be changed during the pretreating the substrate.

In some embodiments, the supply rate of the carbon source to the substrate may be changed according to time during the pre-treating the substrate.

In some embodiments, the supply rate of the hydrogen to the substrate may be changed according to time during the pre-treating the substrate.

In some embodiments, both the supply rate of the carbon source to the substrate and the supply rate of the hydrogen to the substrate may be changed according to time during the pre-treating the substrate.

In some embodiments, the the pre-treating the substrate may include discontinuously supplying the carbon source in the pre-treatment gas to the substrate, discontinuously supplying the hydrogen in the pre-treatment gas to the substrate, or discontinuously suppling both the carbon source and the hydrogen gas in the pretreatment gas to the substrate.

In some embodiments, the carbon source may be continuously supplied to the substrate and the hydrogen may be discontinuously supplied to the substrate during the pre-treating the substrate.

In some embodiments, the carbon source may be discontinuously supplied to the substrate and the hydrogen may be continuously supplied to the substrate during the pre-treating the substrate.

In some embodiments, both of the carbon source and the hydrogen may be discontinuously supplied to the substrate during the pre-treating the substrate.

In some embodiments, the pre-treating the substrate may include preparing a mixed pre-treatment gas, based on mixing the carbon source and the hydrogen outside of a chamber, and supplying the mixed pre-treatment gas to the chamber while the substrate is placed in the chamber.

In some embodiments, a supply rate of the mixed pre-treatment gas may change over time during the supplying the mixed pre-treatment gas to the chamber while substrate is placed in the chamber.

In some embodiments, the pre-treating the substrate may include supplying the carbon source and the hydrogen individually supplied to a chamber where the substrate is placed, and the carbon source and the hydrogen may be mixed in the chamber during the pre-treating the substrate.

In some embodiments, the method may further include forming the carbon source using a liquid source or a solid source before the pre-treating the substrate.

In some embodiments, the pre-treating the substrate may include forming a plasma from the pre-treatment gas and exposing the substrate to the plasma.

In some embodiments, the substrate may be a non-metal substrate.

In some embodiments, the non-metal substrate may include a semiconductor substrate or a dielectric substrate.

In some embodiments, the method of pre-treating the substrate may not include pre-treating the substrate using an other pre-treatment gas that only includes hydrogen.

According to some embodiments, a method of forming graphene may include preparing a pre-treated substrate by performing one of the above-described methods to pretreat the substrate and directly growing graphene on the pre-treated substrate.

In some embodiments, the directly growing the graphene using a source of carbon that may be formed using a liquid source or a solid source.

In some embodiments, the liquid source includes an aromatic hydrocarbon benzene having at least one of a benzene ring, a toluene, a xylene, or anisole, or a derivative of these materials.

In some embodiments, the liquid source may include an aliphatic hydrocarbon hexane having a C—C single bond, an octane, or an ethanol.

In some embodiments, the directly growing graphene may include a doping process.

In some embodiments, the doping process may use a doping gas, and the doping gas may include $NH_3$, $NO_2$, $BH_3$, $B_2H_6$, or a combination thereof.

In some embodiments, the pre-treating the substrate may increase a k-value of the substrate to a value that is greater than 2.70 and less than about 2.80.

In some embodiments, the pre-treating the substrate may decrease an absorbance of the substrate, measured at a wavenumber corresponding to a D band of graphene, to a value that is about 0.26

In some embodiments, the substrate may have an absorbance peak corresponding to a G band of graphene after the pre-treating the substrate.

In some embodiments, the pre-treating the substrate may increase a k-value of the substrate to a value that is greater than 2.70 and less than about 2.80.

According to some embodiments, a pre-treated substrate may be prepared by one of the foregoing methods of a pre-treating a substrate.

BRIEF DESCRIPTION OF THE DRAWINGS

These and/or other aspects will become apparent and more readily appreciated from the following description of the embodiments, taken in conjunction with the accompanying drawings in which:

FIG. 6A is a table showing an example of supply methods of a carbon source and hydrogen included in the pre-treatment gas in the case of FIG. 5.

DETAILED DESCRIPTION

Figure 1:
FIGS. 1 through 4 are cross-sectional views showing steps of a method of forming graphene according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In order to apply graphene to a semiconductor process, the graphene should be able to directly grow on a non-catalyst substrate or a non-metal substrate at a relatively low temperature (for example, 1000° C. or less). In order to directly grow graphene on a non-catalyst substrate at a low temperature, a plasma process may be used to activate a carbon source gas. The plasma process may change physical properties of the non-catalyst substrate, and thus, the use of the plasma process may be limited.

A pre-treating process with respect to the non-catalyst substrate may be performed before directly forming graphene on the non-catalyst substrate, and thus, residues and oxides may be removed from a surface of the non-catalyst substrate. In the pre-treating process, hydrogen plasma may be used. However, the physical properties of the non-catalyst substrate exposed to the hydrogen plasma may be changed. As a result, a k value (dielectric constant) of the non-catalyst substrate may be increased, and the amount of $CH_3$ may be reduced on a surface of the non-catalyst substrate.

Thus, as a method of pre-treating a substrate, by which the efficiency of forming graphene may be increased by reducing and/or minimizing the change of the physical properties of the substrate in a method of directly forming graphene on a non-catalyst substrate at a low temperature, a case in which a pre-treatment gas including hydrogen and carbon is used is introduced.

Hereinafter, methods of pre-treating a substrate and methods of directly forming graphene by using the methods of pre-treating according to an embodiment will be described in detail with reference to the accompanying drawings. In the drawings, thicknesses of layers or regions are exaggerated for clarity of the specification.

FIGS. 1 through 4 are cross-sectional views showing steps of a method of forming graphene according to an embodiment.

Figure 2:
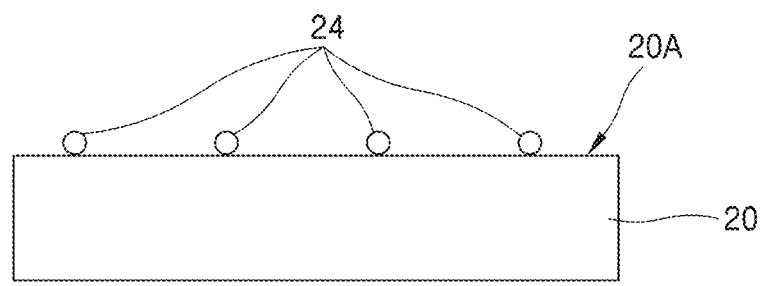

Referring to FIG. 1, in the method of forming graphene according to an embodiment, a surface 20A of a substrate 20 on which graphene will be formed is pre-treated in advance. The surface 20A on which the graphene will be formed may be, for example, an upper surface of the substrate 20. Through pre-treatment of the substrate 20, residues (for example, oxides) that may be obstacles for growing graphene may be removed from the surface 20A of the substrate 20 on which the graphene will be formed. Also, as depicted in FIG. 2, graphene seeds 24 may be formed on some regions of the surface 20A of the substrate 20 by the pre-treatment process. The graphene seeds 24 include carbon. In a subsequent process for forming graphene, graphene may grow from the graphene seeds 24.

The pre-treatment may be a process of exposing the surface 20A of the substrate 20 on which graphene will be formed to plasma of a pre-treatment gas. The plasma of a pre-treatment gas may denote plasma including a pre-treatment gas. A pre-treatment gas used in the pre-treatment process may include at least a carbon source and a hydrogen gas $H_2$, and the carbon source may be a carbon precursor gas including carbon. The pre-treatment gas may further include other components besides the carbon source and hydrogen, for example, at least one of nitrogen $N_2$ and a noble gas. Here, the noble gas may denote an inert gas, an inactive gas, or a rare gas, that is, elements of Group 18 in the Periodic Table, the outermost shell of which is completely filled with electrons, and thus, it is difficult to form a chemical bond. As a result, the pre-treatment gas may be a gas mixture including at least a carbon source and hydrogen among a carbon source, hydrogen, nitrogen, and noble gas.

In the pre-treatment gas, the carbon source may exist as a precursor type. For example, the carbon source may be included in the pre-treatment gas as a $C_xH_y$ (x:1~12, y:2~26) type. In $C_xH_y$, x may be in a range of 1 to 12 and y may be in a range of 2 to 26. $C_xH_y$ may be, for example, $CH_4$, $C_2H_2$, $C_2H_4$, $C_2H_6$, $C_3H_8$, $C_5H_{12}$, etc. If the carbon source of the pre-treatment gas is obtained from a liquid source or a solid source, the carbon source may be a type different from $C_xH_y$, for example, CHO type. The noble gas may include one or more of He, Ne, Ar, Kr, Xe, etc. The substrate 20 may include a non-metal substrate or a non-catalyst substrate. The non-metal substrate may include a semiconductor substrate, such as a Si substrate, a Ge substrate, a SiGe substrate, and a GaAs substrate and/or the non-metal substrate may be a dielectric substrate, but the non-metal substrate is not limited thereto. The dielectric substrate may be a $SiO_2$ substrate, a $Si_3N_4$ substrate, or a $SiC_xO_yH_z$ (0<x<2, 1<y<2.5, 0<z<6) substrate, but is not limited thereto.

The pre-treatment process may be performed under various process conditions. As an example, in the pre-treatment process, the substrate 20 may be maintained at a temperature lower than 1,000° C., for example, in a range from about 200° C. to about 700° C. The pre-treatment process may be performed under a pressure in a range from about 0.01 torr to about 5.0 torr together with the temperature described above. In the pre-treatment process, a microwave (MW) plasma frequency band for forming plasma of a pre-treatment gas may be in a range from about 0.7 GHz to about 2.5 GHz, and/or a radio frequency (RF) plasma frequency band may be in a range from about 3 MHz to about 100 MHz. In the pre-treatment process, power for forming plasma of a pre-treatment gas may be in a range from about 10 W to about 4,000 W. The process conditions for the pre-treatment process may be applied to a main process, that is, a process of directly growing graphene after the pre-treatment process, but the process condition of the main process may be different from the process condition of the pre-treatment process. As an example, the rate of carbon supply for growing graphene in the main process may be greater than that in the pre-treatment process. Also, the rate of hydrogen supply in the main process may be lower than that in the pre-treatment process. Also, the temperature of the substrate 20 in the main process may be maintained at a greater temperature than that in the pre-treatment process. Also, power for forming plasma in the main process may be less than that in the pre-treatment process.

In the process of the pre-treatment process, the surface 20A of the substrate 20 on which graphene will be formed is exposed to plasma of a pre-treatment gas. Accordingly, the pre-treatment process may be referred to as a process of exposing the substrate 20 to the plasma of a pre-treatment gas. As a result of the process of the pre-treatment process, residues (for example, oxides) may be removed from the surface 20A of the substrate 20 on which graphene will be formed. Also, carbon in the pre-treatment gas that is activated while the pre-treatment gas is converted into plasma may be adsorbed on the surface 20A of the substrate 20 on which graphene will be formed. As a result, after the pre-treatment process is completed, as depicted in FIG. 2, carbons may be distributed in places to places on the surface 20A of the substrate 20 on which graphene will be formed. The distributed carbons may act as graphene seeds 24 and may become nuclei for graphene growth. In the subsequent main process, the graphene-grow starts from the graphene seeds 24.

Considering that the graphene seeds 24 are formed on the surface 20A of the substrate 20 on which graphene will be formed by the pre-treatment process, the pre-treatment process may be referred to as a process of forming graphene seeds.

Figure 3:
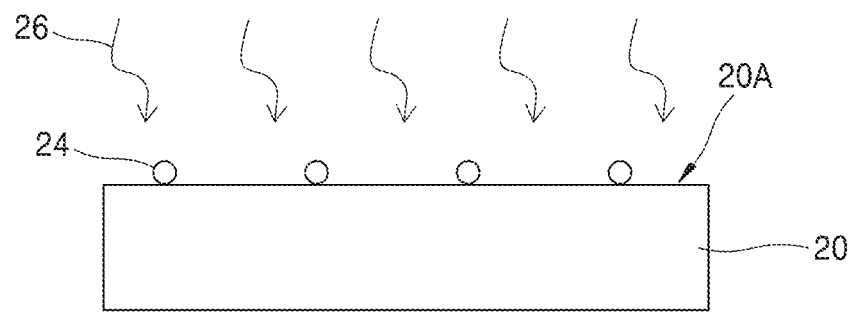
Figure 4:
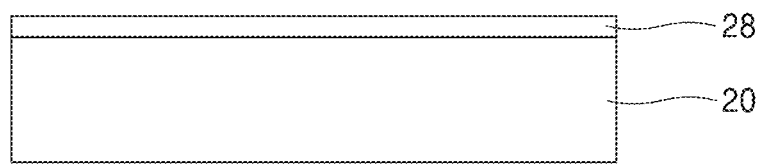

After the graphene seeds 24 are formed on the surface 20A of the substrate 20 on which graphene will be formed by the pre-treatment process, as depicted in FIG. 3, a carbon source 26 is supplied onto the surface 20A to form graphene on the surface 20A of the substrate 20. The carbon source 26 may be supplied in a plasma type. Carbons included in the carbon source 26 may be adsorbed onto the substrate 20 around the graphene seeds 24. In this way, graphene may grow in a lateral direction around the graphene seeds 24 on the surface 20A of the substrate 20, and as a result, as depicted in FIG. 4, a graphene layer 28 may be formed on the surface 20A of the substrate 20. In the process of forming the graphene layer 28, a doping with respect to the graphene layer 28 may be performed according to the use of the graphene. A gas for doping may be, for example, one of $NH_3$, $NO_2$, $BH_3$, and $B_2H_6$ or at least one of these materials. The carbon source 26 may be, for example, an aliphatic carbon material including $CH_4$ and/or $C_2H_2$ and/or an aromatic carbon material.

The carbon source 26 may be supplied in a plasma type. When the carbon source 26 is supplied onto the substrate 20, carbons included in the carbon source 26 are supplied by dividing into individual carbons. For this purpose, plasma may be irradiated to the carbon source 26. At this point, the plasma may include at least one of $H_2$, Ar, and $N_2$. Energy of the plasma may be controlled according to the kind of the carbon source 26. A plurality of carbons include in the carbon source 26 may be separated by the plasma process and are supplied onto the substrate 20. When the carbon source 26 is an aromatic carbon material, the plasma irradiation may be performed to remove materials (for example, hydrogen) attached to rings of the aromatic carbon material like branches while the hexagonal ring shape of the aromatic carbon material is maintained instead of individually separating the carbons in the carbon source 26. The energy intensity of plasma irradiated onto the carbon source 22 may be controlled according to the kind of the carbon source 26.

When the carbon source 26 is supplied, a gas source may be used, but a liquid source or a solid source may also be used. When a liquid source is used in supplying the carbon source 26, a gas state carbon source may be supplied by generating bubbles in a container in which the liquid source is contained. When a solid source is used in supplying the carbon source 26, a carbon source in a gas state may be supplied by heating the solid source. Both the liquid source and the solid source may include a carbon compound including the carbon source 26. As an example, the liquid source may include one of aromatic hydrocarbon benzene having at least one benzene ring, toluene, xylene, anisole, and a derivative of these materials. As another embodiment, the liquid source may include one of aliphatic hydrocarbon hexane having a C—C single bond, octane, and ethanol.

In the method of directly forming graphene as depicted in FIGS. 1 through 4, the substrate 20 is loaded in a chamber before starting the pre-treatment process, and an inner state of the chamber is set suitable for the pre-treatment process. A pre-treatment gas may be supplied into the chamber through individual supply lines or a common supply line.

Figure 5:
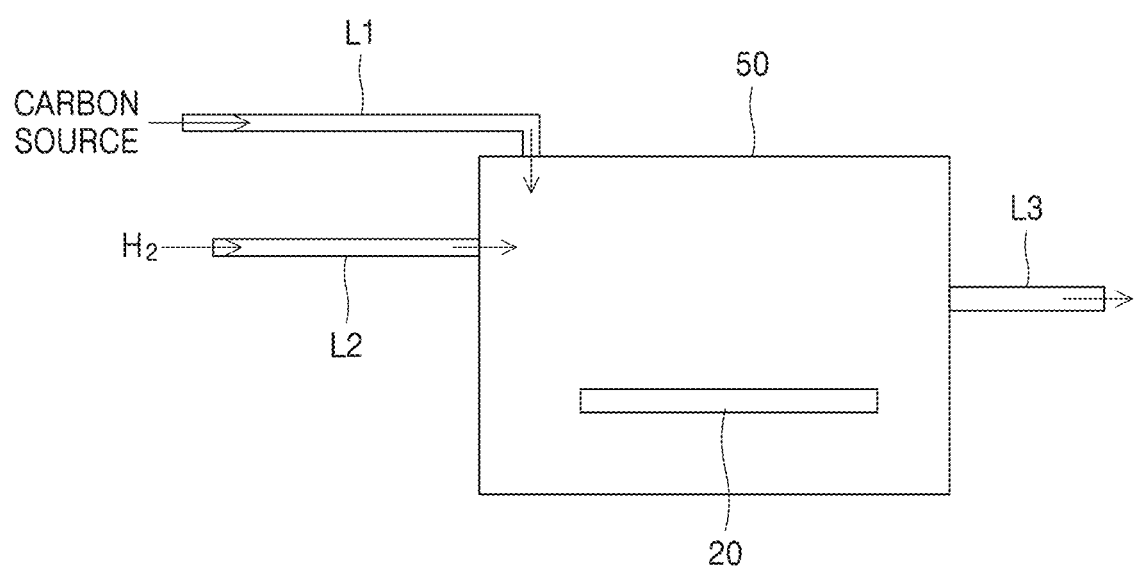
FIG. 5 is a cross-sectional view showing a case in which a carbon source and hydrogen, among gas components of a pre-treatment gas in a method of directly forming graphene, are independently supplied into a chamber and mixed in the chamber.

FIG. 5 is a cross-sectional view showing a case in which a carbon source and hydrogen, among gas components of a pre-treatment gas in a method of directly forming graphene are independently supplied into a chamber and mixed in the chamber.

Referring to FIG. 5, first through third gas lines L1, L2, and L3 through which gases are supplied to or discharged from a chamber 50 are connected to the chamber 50 in which a process of directly growing graphene is performed. A carbon source, that is, a carbon precursor may be supplied through the first gas line L1, and hydrogen may be supplied through the second gas line L2. Residue gases in the chamber 50 may be discharged through the third gas line L3 during a process of directly growing graphene or after the process is completed.

When a mixed pre-treatment gas is formed in the chamber 50 by individually supplying a carbon source and hydrogen of the gas components of the pre-treatment gas, the supply rates of gas components of pre-treatment gas may be controlled. As an example, the supply rates of the gas components of pre-treatment gas may be equal or different according to time.

FIG. 6A is a Table showing an example of supply methods of the carbon source and the hydrogen included in the pre-treatment gas in the case of FIG. 5.

Referring to FIG. 6A, as a first supply method, a carbon source and hydrogen may be continuously supplied into the chamber 50. As a second supply method, hydrogen may be continuously supplied and a carbon source may be discontinuously supplied. As a third supply method, a carbon source may be continuously supplied and hydrogen may be discontinuously supplied. As a fourth supply method, both a carbon source and hydrogen may be discontinuously supplied. In the methods of FIG. 6A, the discontinuously supplying method is a method of repeating the gas supply and stopping the gas supply by using a time division method. In the time division method, the gas supply time may be constant or changed in the repeating operation, but the gas supply rate may be changed even though the gas supply time is maintained as constant in the repeating operation.

Figure 6B:
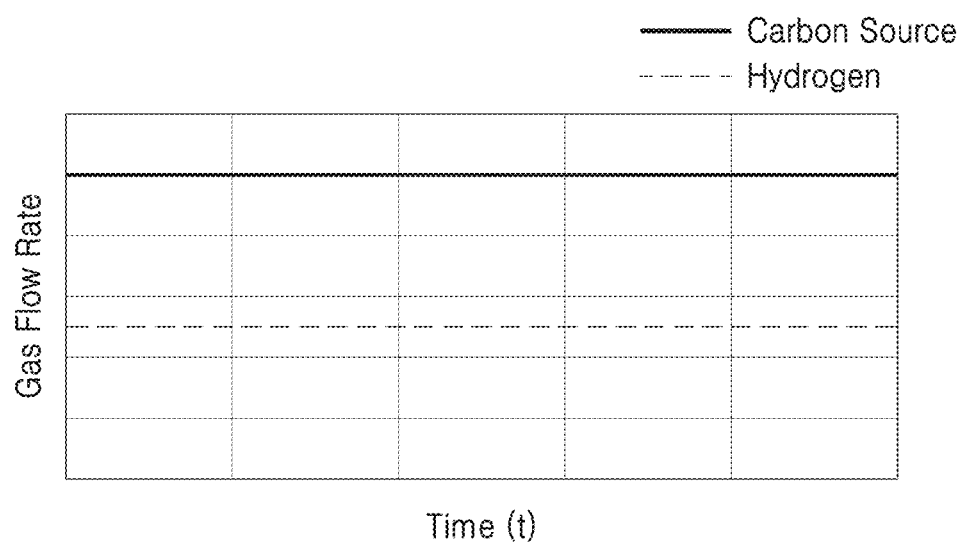
FIG. 6B is a timing diagram showing an example of the first supply method of FIG. 5.
Figure 6C:
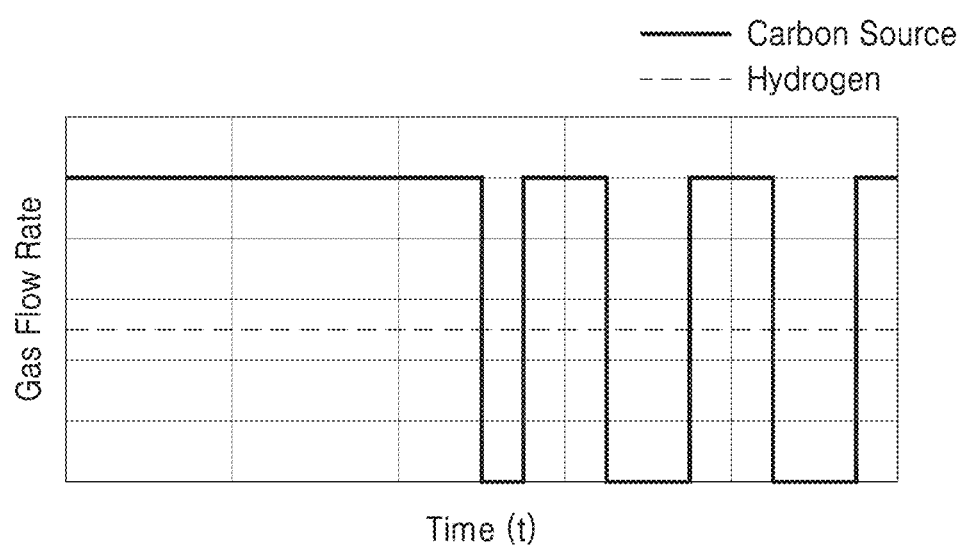
FIG. 6C is a timing diagram showing an example of the second supply method of FIG. 5.

In the first supply method, the gas supply rate may be constant or changed according to time. As an example, FIG. 6B shows the supply rates of a carbon source and hydrogen in the first supply method respectively may be constant. However, at least one of the supply rates of the carbon source and the hydrogen in the first supply method may be changed while maintaining continuity of gas supply. FIG. 6C shows an example of the second supply method. Referring to FIG. 6C, hydrogen is continuously supplied and a carbon source is discontinuously supply by using the time division method.

Figure 7:
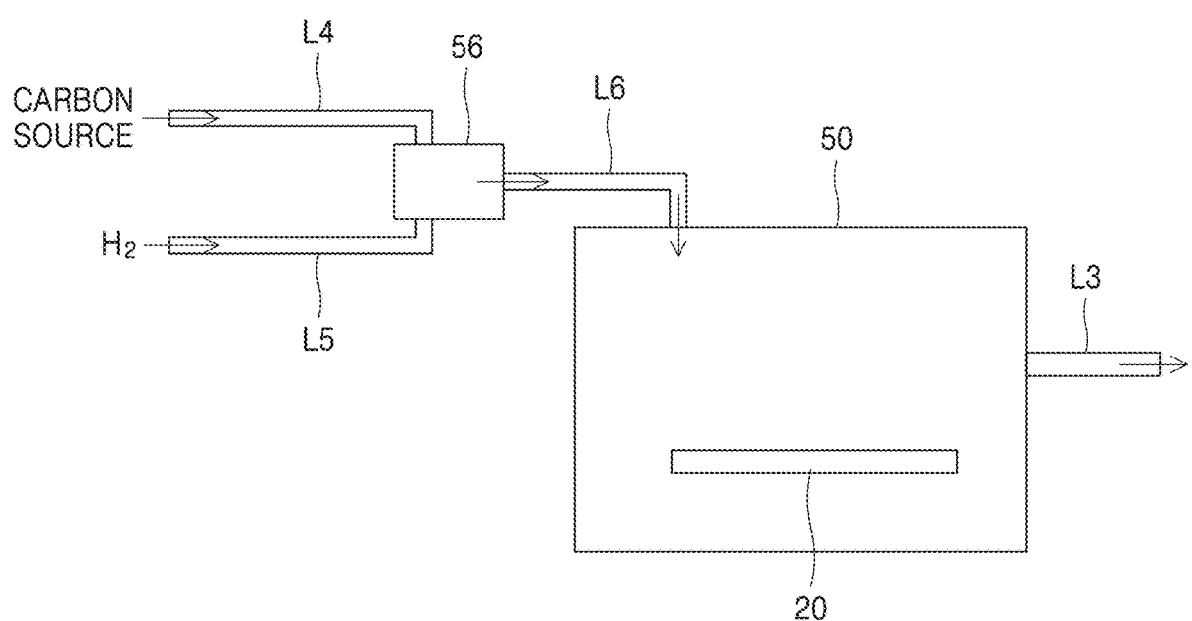
FIG. 7 is a cross-sectional view showing a case in which a carbon source and hydrogen, among gas components of a pre-treatment gas in a method of directly forming graphene, are supplied into a chamber after mixing the carbon source and the hydrogen outside the chamber.

FIG. 7 shows a case in which a carbon source and hydrogen are supplied into the chamber 50 after mixing the carbon source and the hydrogen source outside the chamber 50 in a method of directly forming graphene.

Referring to FIG. 7, the third gas line L3 and a sixth gas line L6 are connected to the chamber 50. An end of the sixth gas line L6 is connected to the chamber 50 and the other end is connected to a mixing container or a mixer 56. A pre-treatment gas mixture is formed in the mixer 56, and a carbon source and hydrogen respectively are supplied to the mixer 56 through fourth and fifth gas lines L4 and L5 that are connected to the mixer 56. The pre-treatment gas mixture formed in the mixer 56 is supplied to the chamber 50 through the sixth gas line L6.

In this way, in the method in which the pre-treatment gas is supplied to the chamber 50 after the pre-treatment gas is mixed outside the chamber 50, the mixed pre-treatment gas may be continuously supplied to the chamber 50 at a constant rate or supplied to the chamber 50 by using a time division method. When the mixed pre-treatment gas is supplied to the chamber 50 by using a time division method, the mixed pre-treatment gas may be supplied for a certain period of time and may be stopped for a certain period of time. In the case of the time division method, the time for supplying and the time for stopping the supply of the mixed pre-treatment gas may be equal to or different from each other, and may be controlled in a direction to improve and/or maximize the pre-treatment efficiency.

In both cases when the mixed pre-treatment gas is continuously supplied and is supplied by using a time division method, the supply of the mixed pre-treatment gas may be performed in various ways according to a gas supply rate and pressure. For example, when the mixed pre-treatment gas is continuously supplied, the supply rate of the mixed pre-treatment gas supplied to the chamber 50 may be changed. In other words, the mixed pre-treatment gas may be supplied to the chamber 50 at a first supply rate for a first set time, and the mixed pre-treatment gas may be supplied to the chamber 50 at a second supply rate for a second set time.

When the mixed pre-treatment gas is supplied to the chamber 50 by using a time division method, in every operation of supplying the mixed pre-treatment gas, the supply rates of the mixed pre-treatment gas supplied to the chamber 50 may be controlled equal to or different from each other. In the time division method, a single supply time and a single stopping time may constitute a unit supply cycle, and the unit supply cycle may be repeated greater than twice. In this case, the supply time and the stopping time of the unit supply cycle may be equal to or different from each other. As an example of the case in which the supply time and the stopping time of each unit supply cycle are different, a supply time in a first unit supply cycle may be greater or less than a supply time in a second unit supply cycle.

Figure 8:
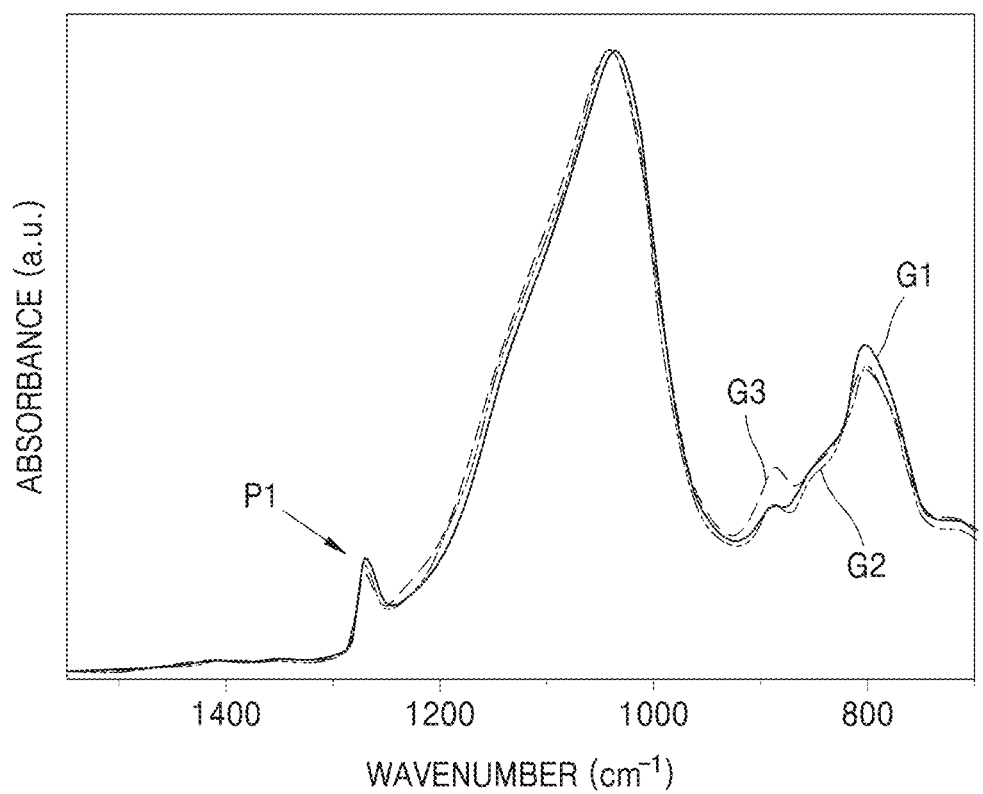
FIG. 8 is a graph showing a test result of measuring the change of a Si—$CH_3$ bond in an Inter-Metal Dielectric (IMD) substrate when the IMD substrate is pre-treated according to a pre-treating method applied to a method of directly forming graphene according to an embodiment and when the IMD substrate is pre-treated according to a pre-treating method applied to a method of directly forming graphene of the related art.

FIG. 8 shows a test result of measuring the change of a Si—$CH_3$ bond in an Inter-Metal Dielectric (IMD) substrate (for example, $SiO_2$ substrate) when the IMD substrate is pre-treated according to the pre-treating method applied to a method of directly forming graphene according to an embodiment and when the IMD substrate is pre-treated according to a pre-treating method applied to a method of directly forming graphene of the related art. The substrate pre-treatment method applied to the method of directly forming graphene of the related art may denote a case of substrate pre-treatment by using a pre-treatment gas that includes hydrogen but does not include a carbon source.

Figure 9:
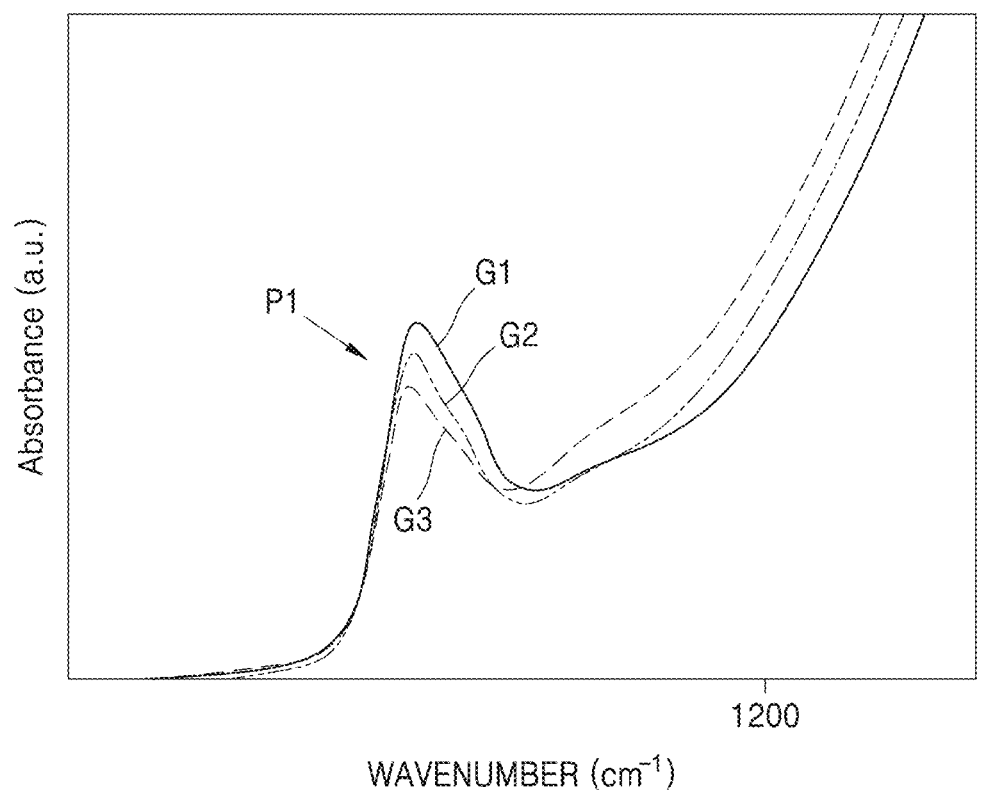
FIG. 9 is a magnified graph of a first peak P1 that shows the presence of a Si—$CH_3$ bond in FIG. 8.

FIG. 9 is a magnified graph of a first peak P1 that shows the presence of Si-$CH_3$ bond in FIG. 8. In FIGS. 8 and 9, the horizontal axis represents wavenumber and the vertical axis represents absorbance. The absorbance may be measured by using a Fourier Transform Infra-Red (FTIR) spectroscopy method.

In FIG. 9, a first graph G1 shows a result with respect to a substrate that is not pre-treated, a second graph G2 shows a result with respect to a substrate that is pre-treated according to the substrate pre-treatment method applied to the method of directly forming graphene according to an embodiment. A third graph G3 shows a result with respect to a substrate that is pre-treated according to the substrate pre-treatment method applied to the method of directly forming graphene of the related art.

When a first peak P1 of the first through third graphs G1, G2, and G3 in FIG. 9 is observed, the absorbance is the highest in the substrate that is not pre-treated, and is the lowest in the substrate that is pre-treated according to the substrate pre-treatment method applied to the method of directly forming graphene of the related art. The absorbance of the substrate that is pre-treated according to the substrate pre-treatment method applied to the method of directly forming graphene according to an embodiment is in a medium level. The result denotes that the amount of Si—$CH_3$ bonds is the largest in the substrate that is not pre-treated, and is the least in the substrate that is pre-treated according to the substrate pre-treatment method applied to the method of directly forming graphene of the related art. The result also denotes that the amount of Si—$CH_3$ bonds is in a medium level in the substrate that is pre-treated according to the substrate pre-treatment method applied to the method of directly forming graphene according to an embodiment. The result may denote that the amount of the Si—$CH_3$ bonds present in the substrate that is pre-treated according to the substrate pre-treatment method applied to the method of directly forming graphene according to an embodiment is greater than that in the substrate that is pre-treated according to the substrate pre-treatment method applied to the method of directly forming graphene of the related art. In other words, when a substrate is pre-treated according to the substrate pre-treatment method applied to the method of directly forming graphene according to an embodiment, the reduction of $CH_3$ on a surface of the substrate may be reduced than in a substrate that is pre-treated according to the substrate pre-treatment method applied to the method of directly forming graphene of the related art.

The result indicates that, when a substrate is pre-treated according to the substrate pre-treatment method applied to the method of directly forming graphene according to an embodiment, the absorbance of carbon is advantageous when growing graphene, and thus, the growing of graphene is promoted.

Table 1 shows the quantification of the results of FIG. 8 and the variation of k value in a method of directly forming graphene according to an embodiment and a method of directly forming graphene of the related art.

TABLE 1

| Substrate pre-treatment method | Si—$CH_3$ | k(C—V) |
|---|---|---|
| Bare | 0.275 | 2.70 |
| Hydrogen plasma pre-treatment | 0.249 | 2.85 |
| Carbon + Hydrogen plasma pre-treatment | 0.262 | 2.78 |

In Table 1, "Bare" indicates a substrate that is not pre-treated The "Hydrogen plasma pre-treatment" indicates a case in which a substrate is pre-treated according to the substrate pre-treatment method applied to the method of directly forming graphene of the related art. Also, the "Carbon+Hydrogen plasma pre-treatment" indicates a case in which a substrate is pre-treated according to the substrate pre-treatment method applied to the method of directly forming graphene according to an embodiment. "Si—$CH_3$" indicates Si—$CH_3$ bonds.

Referring to FIG. 9 and Table 1, in the substrate that is pre-treated according to the substrate pre-treatment method applied to the method of directly forming graphene according to an embodiment, a figure that indicates the presence of Si—$CH_3$ bonds is 0.262. On the other hand, in the substrate that is pre-treated according to the substrate pre-treatment method of the related art, a figure that indicates the presence of Si—$CH_3$ bonds is 0.249 which is the lowest, and, in the substrate that is not pre-treated, a figure that indicates the presence of Si—$CH_3$ bonds is 0.275 which is the highest. In the case of k values, the k value is the lowest (2.7) in the substrate that is not pre-treated, the k value is the highest (2.85) in the substrate that is pre-treated according to the substrate pre-treatment method of the related art, and the k value (2.78) of the substrate that is pre-treated according to the substrate pre-treatment method applied to the method of directly forming graphene according to an embodiment is greater than that of the substrate that is not pre-treated and is less than that of the substrate that is pre-treated according to the substrate pre-treatment method of the related art.

Figure 10:
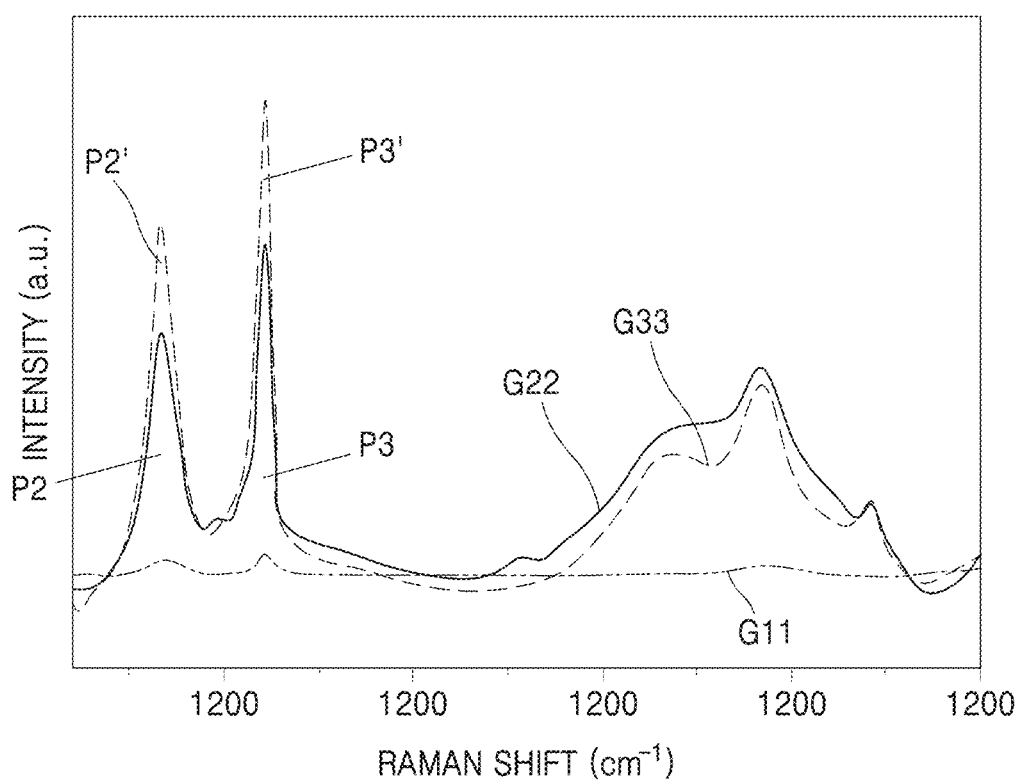
FIG. 10 is a graph showing a measurement result of Raman intensities with respect to graphene obtained by using a method of directly forming graphene according to an embodiment, the method including a process of pre-treating a substrate with a pre-treatment gas that includes both a carbon source and a hydrogen source, and graphene obtained by using a method of directly forming graphene of the related art, the method including a process of pre-treating a substrate with a pre-treatment gas that includes only one of a carbon source and a hydrogen source.

FIG. 10 is a graph showing a measurement result of Raman intensities with respect to graphene obtained by using a method of directly forming graphene according to an embodiment, the method including a process of pre-treating a substrate with a pre-treatment gas that includes both a carbon source and a hydrogen source, and graphene obtained by using a method of directly forming graphene of the related art, the method including a process of pre-treating a substrate with a pre-treatment gas that includes only a hydrogen source. These two methods were performed at a temperature lower than 1,000° C., for example, 400° C., and a silicon substrate is used as a substrate for directly growing graphene.

In FIG. 10, the horizontal axis represents Raman shift, and the vertical axis represents Raman intensity. A first graph G11 indicates a measurement result with respect to a substrate before forming graphene and immediately after a pre-treatment by using the substrate pre-treatment method applied to the method of directly forming graphene according to an embodiment. A second graph G22 indicates a measurement result with respect to graphene obtained by using the method of directly forming graphene of the related art. A third graph G33 indicates a measurement result with respect to graphene obtained by using the method of directly forming graphene according to an embodiment.

Referring to FIG. 10, a meaningful peak is not seen on the first graph G11, and this is regarded as a natural result since graphene is not present on the substrate immediately after the pre-treatment.

In second and third graphs G22 and G33, second peaks P2 and P2' are present on the same locations and third peaks P3 and P3' are also present on the same locations. The second peaks P2 and P2' indicate a D band, and the third peaks P3 and P3' indicate a G band. The second peaks P2 and P2' and the third peaks P3 and P3' indicate the presence of graphene. That is, the second peaks P2 and P2' and the third peaks P3 and P3' appeared on the second and third graphs G22 and G33 denote that graphene is grown on the substrate that is pre-treated. The locations of the second and third peaks P2 and P3 appeared on the second graph G22 are the same as the locations of the second and third peaks P2' and P3' appeared on the third graph G33. However, heights of the second and third peaks P2' and P3' appeared on the third graph G33 are higher than those of the second and third peaks P2 and P3 appeared on the second graph G22. The result indicates that a greater amount of graphene may be formed when the graphene is formed by using the method of directly forming graphene according to an embodiment than the method of directly forming graphene of the related art.

In the substrate pre-treatment method according to an embodiment and the method of directly forming graphene using the substrate pre-treatment method, a pre-treatment gas including together a carbon source and hydrogen is used as a pre-treatment gas. The increase in the k value (dielectric constant) of the non-catalyst substrate may be suppressed when a pre-treatment gas including both a carbon source and hydrogen is used than when a pre-treatment gas including only hydrogen of the related art is used.

Also, the reduction rate of $CH_3$ on a surface of the substrate may be reduced by pre-treating a substrate with plasma of a pre-treatment gas including together a carbon source and hydrogen than when a substrate is pre-treated with plasma of a pre-treatment gas including only hydrogen of the related art. Accordingly, a greater amount of $CH_3$ may be present on a surface of a substrate than when the substrate is pre-treated with plasma of a pre-treatment gas including only hydrogen of the related art. The $CH_3$ present on the surface of the substrate may advantageously induce the absorbance of carbon during growing graphene, and thus, the growing of the graphene may be promoted.

Figure 11:
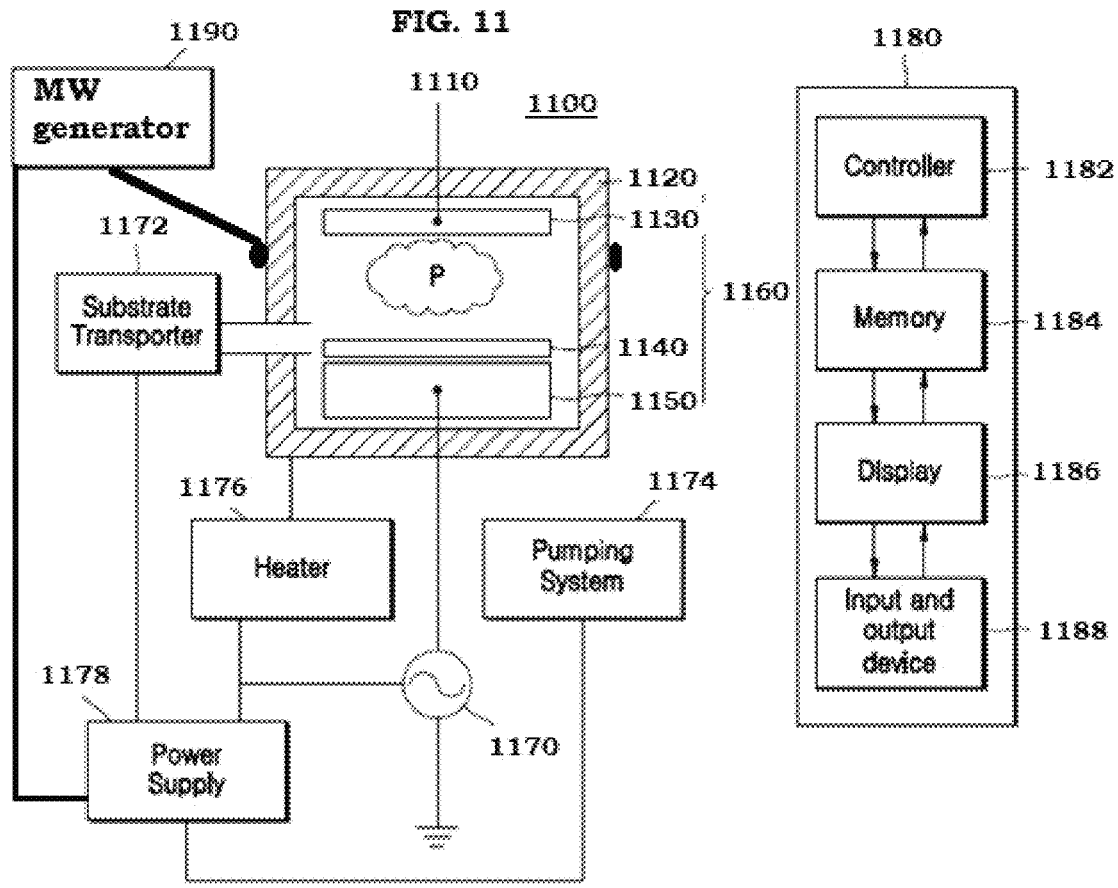
FIG. 11 is a cross-sectional view of an apparatus for forming graphene according to some example embodiments.

FIG. 11 a cross-sectional view of an apparatus for forming graphene according to some example embodiments.

Referring to FIG. 11, the apparatus 1100 may be configured to form a graphene product according to any one of the embodiments in FIGS. 1 to 5 and 7 of the present application.

The apparatus 1100 may include a gas supply 1110, a process chamber 1160, a plasma generation unit 1170 (e.g., RF generator), microwave generator 1190 (e.g., magnetron), a substrate transporter 1172, a pumping system 1174, a heater 1176, a power supply 1178, and an operation station 1180. The process chamber 1160 may include a chamber housing 1120, an upper electrode 1130 in the chamber housing 1120, and a substrate support 1150 in the chamber housing 1120. The upper electrode 1130 may be connected to a gas supply 1110 with conduits and gas flow controllers for providing reaction gases into the process chamber 1160. The substrate support 1310 may be an electrostatic chuck, but is not limited thereto.

Although not illustrated in FIG. 11, the gases (e.g., gases for pretreatment gas, gases for reaction gas) may be mixed outside the process chamber 1160, like the arrangement in FIG. 7, or individually delivered to the process chamber 1160 like the arrangement in FIG. 5.

A substrate transporter 1172, such as a robot arm, may transport a substrate 1140 into and out of the process chamber 1160. The process chamber 1160 may include a gate valve that opens when the substrate transporter 1172 transports the substrate 1140 into or out of the process chamber 1160 and closes when the process chamber 1160 performs operations (e.g., vacuum processes). A heater 1176 may control the temperature of the substrate support 1150, inner wall of process chamber 1160, and upper electrode 1130. An RF power generator 1170, may be connected to the substrate support 1150 and may be used to generate a plasma P of a reaction gas in the process chamber 1160. Alternatively, or in addition, the microwave generator 1190 may be used to generate the plasma P in the process chamber 1160. A pumping system 1174 connected to the process chamber 1160 may create a vacuum in the process chamber 1160. A power supply 1178 may provide electrical power to the apparatus 1100.

The operation station 1180 may control operations of the apparatus 1100. The operation station 1180 may include a controller 1182, a memory 1184, a display 1186 (e.g., monitor), and an input and output device 1188. The memory 1184 may include a nonvolatile memory, such as a flash memory, a phase-change random access memory (PRAM), a magneto-resistive RAM (MRAM), a resistive RAM (Re-RAM), or a ferro-electric RAM (FRAM), and/or a volatile memory, such as a static RAM (SRAM), a dynamic RAM (DRAM), or a synchronous DRAM (SDRAM). The input and output device 1188 may be a keyboard or a touch screen.

The memory 1184 may store an operating system and may store recipe instructions that include settings (e.g., gas flow rates, temperature, time, power, pressure, etc.) for different manufacturing processes performed by the apparatus 1100. The memory 1184 may store recipe instructions for pre-treating the substrate 1140 and/or forming graphene directly on the substrate 1140 after the substrate 1140 has been pre-treated according to one or more of the embodiments in FIGS. 1 to 5 and/or 7 of the present application.

The controller 1182 may be, a central processing unit (CPU), a controller, or an application-specific integrated circuit (ASIC), that when, executing recipe instructions stored in the memory 1184 (for one or more of the embodiments in FIGS. 1 to 5 and/or 7) configures the controller 1182 as a special purpose controller that operates apparatus 1100 for performing operations on the substrate 1140 (e.g., pre-treating the substrate, forming graphene directly on the substrate) according to example embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of pre-treating a substrate on which graphene is to be directly formed, the method comprising:
pre-treating the substrate using a pre-treatment gas including at least a carbon source and hydrogen,
wherein, in an initial period of the pre-treating the substrate, the carbon source and the hydrogen are simultaneously supplied to a chamber in which the substrate is disposed,
wherein the pre-treating the substrate is performed in the chamber, and
wherein a graphene seed is present on the substrate immediately after the pre-treating the substrate as a result of the pre-treating and a graphene layer is not present on the substrate immediately after the pre-treating the substrate.

2. The method of claim 1, wherein the pre-treatment gas further includes $N_2$, a noble gas, or both $N_2$ and a noble gas.

3. The method of claim 2, wherein the pre-treating the substrate includes discontinuously supplying the at least one of the carbon source and the hydrogen of the pre-treatment gas to the substrate.

4. The method of claim 2, the pre-treating the substrate includes supplying the carbon source and the hydrogen individually to the chamber where the substrate is placed, and the carbon source and the hydrogen are mixed in the chamber during the pre-treating the substrate.

5. The method of claim 1, wherein
the carbon source is represented by the formula $C_xH_y$,
x is in a range from 2 to 12, and
y is in a range from 2 to 26.

6. The method of claim 1, wherein the pre-treating the substrate includes continuously supplying the carbon source and the hydrogen in the pre-treatment gas during the pre-treating the substrate.

7. The method of claim 6, wherein a supply rate of the carbon source to the substrate and a supply rate of the hydrogen to the substrate are maintained constant during the pre-treating the substrate.

8. The method of claim 6, wherein a supply rate of the carbon source to the substrate, a supply rate of the hydrogen to the substrate, or both the supply rate of the carbon source and the supply rate of the hydrogen to the substrate is changed during the pre-treating the substrate.

9. The method of claim 8, wherein the supply rate of the carbon source to the substrate is changed according to time during the pre-treating the substrate.

10. The method of claim 8, wherein the supply rate of the hydrogen to the substrate is changed according to time during the pre-treating the substrate.

11. The method of claim 8, wherein both the supply rate of the carbon source to the substrate and the supply rate of the hydrogen to the substrate are changed according to time during the pre-treating the substrate.

12. The method of claim 1, wherein the pre-treating the substrate includes discontinuously supplying the carbon source in the pre-treatment gas to the substrate, discontinuously supplying the hydrogen in the pre-treatment gas to the substrate, or discontinuously supplying both the carbon source and the hydrogen gas in the pre-treatment gas to the substrate.

13. The method of claim 12, wherein the carbon source is continuously supplied to the substrate and the hydrogen is discontinuously supplied to the substrate during the pre-treating the substrate.

14. The method of claim 12, wherein the carbon source is discontinuously supplied to the substrate and the hydrogen is continuously supplied to the substrate during the pre-treating the substrate.

15. The method of claim 12, wherein both of the carbon source and the hydrogen are discontinuously supplied to the substrate during the pre-treating the substrate.

16. The method of claim 1, wherein
the pre-treating the substrate includes preparing a mixed pre-treatment gas, based on mixing the carbon source and the hydrogen outside of a chamber, and supplying the mixed pre-treatment gas to the chamber while the substrate is placed in the chamber.

17. The method of claim 16, wherein a supply rate of the mixed pre-treatment gas changes over time during the supplying the mixed pre-treatment gas to the chamber while substrate is placed in the chamber.

18. The method of claim 1, wherein
the pre-treating the substrate includes supplying the carbon source and the hydrogen individually supplied to the chamber where the substrate is placed, and
the carbon source and the hydrogen are mixed in the chamber during the pre-treating the substrate.

19. The method of claim 1, further comprising:
forming the carbon source using a liquid source or a solid source before the pre-treating the substrate.

20. The method of claim 1, wherein the pre-treating the substrate includes:
forming a plasma from the pre-treatment gas; and
exposing the substrate to the plasma.

21. The method of claim 1, wherein the substrate is a non-metal substrate.

22. The method of claim 21, wherein the non-metal substrate includes a semiconductor substrate or a dielectric substrate.

23. A method of forming graphene, the method comprising:
preparing a pre-treated substrate by performing the method of claim 1 to pretreat the substrate; and
directly growing graphene on the pre-treated substrate.

24. The method of claim 23, wherein the directly growing the graphene includes using a source of carbon that is formed using a liquid source or a solid source.

25. The method of claim 24, wherein
the liquid source includes an aromatic hydrocarbon benzene having at least one of a benzene ring, a toluene, a xylene, or anisole, or a derivative of these materials.

26. The method of claim 24, wherein the liquid source includes an aliphatic hydrocarbon hexane having a C—C single bond, an octane, or an ethanol.

27. The method of claim 23, wherein the directly growing graphene includes a doping process.

28. The method of claim 27, wherein
the doping process uses a doping gas, and
the doping gas includes $NH_3$, $NO_2$, $BH_3$, $B_2H_6$, or a combination thereof.

29. The method of claim 1, wherein
during the pre-treating the substrate, the carbon source is supplied to the chamber via a first gas line and the hydrogen is supplied to the chamber via a second gas line, the first gas line and the second gas line are separate from each other and do not merge before connecting to the chamber, and in the initial period of the pre-treating the substrate, a gas flow rate of the carbon source is greater than a gas flow rate of the hydrogen.

30. The method of claim 1, wherein the carbon source is supplied to the chamber via a first gas line and the hydrogen is supplied to the chamber via a second gas line different from the first gas line, the first gas line is directly connected to the chamber, and the second gas line is directly connected to the chamber.

31. The method of claim 2, wherein the pre-treating the substrate includes preparing a mixed pre-treatment gas, based on mixing the carbon source and the hydrogen outside a chamber, and supplying the mixed pre-treatment gas to the chamber while the substrate is placed in the chamber.

\* \* \* \* \*